United States Patent
Appelberg et al.

(10) Patent No.: US 10,650,946 B1
(45) Date of Patent: May 12, 2020

(54) TRIMMING METHOD OF DCR SENSING CIRCUITS

(71) Applicant: Flex Ltd., Singapore (SG)

(72) Inventors: Mikael Appelberg, Farjestaden (SE); Andreas Larsson, Kalmar (SE)

(73) Assignee: Flex Ltd., Singapore (SG)

( * ) Notice: Subject to any disclaimer, the term of this patent is extended or adjusted under 35 U.S.C. 154(b) by 16 days.

(21) Appl. No.: 16/058,742

(22) Filed: Aug. 8, 2018

(51) Int. Cl.
| | |
|---|---|
| *G01R 1/02* | (2006.01) |
| *H01C 17/22* | (2006.01) |
| *H01C 17/24* | (2006.01) |
| *G01R 19/00* | (2006.01) |
| *G01R 35/00* | (2006.01) |
| *H02M 3/158* | (2006.01) |

(52) U.S. Cl.
CPC ......... *H01C 17/24* (2013.01); *G01R 19/0092* (2013.01); *G01R 35/005* (2013.01); *H02M 3/158* (2013.01)

(58) Field of Classification Search
CPC ............ H02M 1/00; H02M 1/08; H02M 1/12; H02M 1/14; H02M 3/157
See application file for complete search history.

(56) References Cited

U.S. PATENT DOCUMENTS

| | | | |
|---|---|---|---|
| 3,830,991 A | 8/1974 | Durocher | |
| 4,017,697 A | 4/1977 | Larson | |
| 4,492,949 A | 1/1985 | Peterson | |
| 5,626,135 A | 5/1997 | Sanfillippo | |
| 6,388,556 B1 | 5/2002 | Imai | |
| 6,483,055 B1 | 11/2002 | Tanabe | |
| 6,964,205 B2 | 11/2005 | Papakostas | |
| 7,112,755 B2 | 9/2006 | Kitano | |
| 7,528,337 B2 | 5/2009 | Tanabe | |
| 7,578,195 B2 | 8/2009 | DeAngelis | |
| 2006/0131158 A1 | 6/2006 | Takiguchi | |
| 2008/0018611 A1 | 1/2008 | Serban | |
| 2008/0139953 A1 | 6/2008 | Baker | |
| 2009/0272197 A1 | 11/2009 | Ridao Granado | |
| 2010/0006336 A1 | 3/2010 | Pisani | |
| 2010/0107770 A1 | 5/2010 | Serban | |
| 2010/0160762 A1 | 6/2010 | McLaughlin | |
| 2010/0018507 A1 | 7/2010 | Jeong | |
| 2011/0157935 A1* | 6/2011 | Bancroft | H02M 3/3388 363/75 |
| 2013/0019383 A1 | 1/2013 | Korkala | |
| 2013/0060115 A1 | 3/2013 | Gehman | |

(Continued)

*Primary Examiner* — Minh N Tang
(74) *Attorney, Agent, or Firm* — Haverstock & Owens LLP

(57) ABSTRACT

A circuit and method provide improved trimming of a DCR sensing circuit where a sensing element is sensitive to self-heating or having a large tolerance. The circuit includes a resistive divider circuit coupled to a sensing element. The resistive divider circuit includes a trim resistor and two test points. Prior to trimming the trim resistor, an actual resistance of the sensing element is determined. A target voltage across the trim resistor to be trimmed is calculated according to the determined sensing element resistance and a known small trim current that is to be injected into the circuit during the trimming process. This injected trim current has a low current value so there is no self-heating of the sensing element. Then, the trim resistor is trimmed while injecting this small trim current into the resistive divider circuit and the voltage across the trim resistor is monitored.

13 Claims, 4 Drawing Sheets

(56) References Cited

U.S. PATENT DOCUMENTS

| | | |
|---|---|---|
| 2014/0015633 A1 | 1/2014 | Nakae |
| 2014/0343390 A1 | 11/2014 | Berzowska |
| 2015/0366504 A1 | 12/2015 | Connor |
| 2017/0172421 A1 | 6/2017 | Dabby |

* cited by examiner

TRIMMING METHOD OF DCR SENSING CIRCUITS

FIELD OF THE INVENTION

The present invention is generally directed to sensing circuits. More specifically, the present invention is directed to an improved trimming method of a DC resistance (DCR) sensing circuit.

BACKGROUND OF THE INVENTION

Power conversion refers to the conversion of one form of electrical power to another desired form and voltage, for example converting 115 or 230 volt alternating current (AC) supplied by a utility company to a regulated lower voltage direct current (DC) for electronic devices, referred to as AC-to-DC power conversion, or converting. Power converters are included as part of the chargers and adapters used by electronic devices such as mobile phones, tablets, laptops, and other mobile electronic devices.

As mobile electronics devices continue to grow in popularity, there are increasing demands for miniaturization (high power density) and portability. In order to achieve such miniaturization and portability, higher switching frequency and higher efficiency are demanded. The size of a power converter is generally related to the device switching frequency and efficiency. A higher switching frequency can decrease the size of energy storage components such as electromagnetic components and electrostatic components. Higher efficiency can decrease the size of a heat sink needed to cool the device. As such, high frequency and high efficiency are future trends in the electronics technology.

A switched-mode power supply, switching-mode power supply or SMPS, is a power supply that incorporates a switching regulator. While a linear regulator uses a transistor biased in its active region to specify an output voltage, an SMPS actively switches a transistor between full saturation and full cutoff at a high rate. The resulting rectangular waveform is then passed through a low-pass filter, typically an inductor and capacitor (LC) circuit, to achieve an approximated output voltage. The switch mode power supply uses the high frequency switch, the transistor, with varying duty cycle to maintain the output voltage. The output voltage variations caused by the switching are filtered out by the LC filter.

In many applications where SMPS are used the requirement for accurate current measurement of the current from the SMPS to the load have been constantly increasing. Traditionally the current has been measured over a resistive shunt, which has provided accurate measurement when the shunt has been a discrete element with a defined resistance.

As the power consumption in the applications has increased, sensing over components used in the conversion process has been used, called DCR (DC Resistance) sensing. This constitutes sensing the current over the resistive part of an inductor (sensing element) or the negative current return path in the PCB. This type of sensing typically offers a tolerance, or variation, of 7 to 10 percent, which is higher than normally required in a modern application. Another method is to integrate the sensing element into an integrated power circuit, which is a part of the power conversion process. This type of circuit is only available for certain applications and not applicable to all topologies.

The concept of resistive trimming using DCR sensing has been used for many years. Trimming reduces the variation of the resistive part of the sensing element, such as the inductor in the SMPS. The variation can be compensated for, and thereby reduced if not eliminated, through the use of a digital controller. Such compensation can be performed by first reporting the value of a current being drawn from the device (SMPS) using a non-calibrated coefficient K in the digital controller. The value is reported to a measurement system, which compares the current read by the SMPS with a reference current. The coefficient K is then updated by multiplying K by the ratio of the reference current and the current reported by the SMPS.

In other applications, a digital controller is not included. One method to calibrate the current in a device not having a digital controller is to use a resistive divider over the sensing element, where one of the resistors in the resistive divider is trimmed to a desired value using trimming equipment. This method relies on a current being drawn through the device during the entire trimming process. FIG. 1 illustrates an exemplary simple SMPS circuit schematic to which DCR sensing is applied. The input voltage, V11, is pulse width modulated (PWM) by transistors T11 and T12. The resulting PWM waveform at switching node SW is then averaged to a DC voltage by the filter formed by inductor L11 and capacitor C11. Current provided to a load is represented as I11. The SMPS circuit shown in FIG. 1 does not include a digital controller for implementing DCR sensing. Instead, a resistive divider including resistors R11 and R12 is coupled across the inductor L11 for implementing DCR sensing. The inductor L11 is considered the sensing element and includes both an inductance part L and a resistance part RL. The SMPS is operated so as to generate a PWM signal at the switching node SW, and current is drawn through the branching current pathways to the load, specifically branching at the inductor L11 and the resistor R11, and branching at the capacitor C12 and the resistor R12. The characteristics of the resistive divider components R11, R12, C12 are chosen such that a cutoff frequency of the RC-filter R11, R12, C12 is matched to a cutoff frequency of the inductor L11. With such a configuration, a voltage over the capacitor C12, and therefore also over the resistor R12, is proportional to the voltage over the resistance part RL, which enables indirect measurement of the current through the resistive part RL. The resistive divider formed by resistors R11, R12 allows trimming of the value of the resistive part RL of the inductor L11, and can be achieved by trimming of either of the resistors R11 or R12. In the example shown in FIG. 1, the resistor R12 is a trim resistor. To trim the trim resistor R12, the device is turned ON thereby drawing current through the device, and the resistor R12 is trimmed to a desired value according to a monitored voltage measurement taken between the nodes at test point TP and Vout. A problem with this technique is that the trimming process is relatively slow, e.g. in the range of seconds, and a relatively large current, e.g. 10-50 amps, is required to pass through the sensing element (inductor L11) during the entire trimming process. The trimming time is long enough that the resistive part RL of the sensing element increases in temperature as current is run through it, referred to as self-heating, and the increased temperature significantly reduces the obtainable accuracy of the trimming procedure. In particular, since the resistivity of the sensing element (inductor L11) has a large temperature coefficient, the resistance value of the resistance part RL will change during the trimming process. This can be remedied by using a temperature compensation unit coupled to the sensing element. However, there is a mismatch between the thermal time constant of the sensing element and the thermal time constant of the temperature compensation unit, resulting in the sensing element RL being compensated not having the same temperature as the thermal sensor. As such, compensation applied according to the temperature compensation unit is not completely accurate. The mismatched time constants, together with the requirement on the trimming system to constantly update its target value, since the self heating of the sense element will result in the target voltage having to be updated depending on the sense element temperature, makes this method highly unreliable. Also, since the actual time to perform the trimming may vary from device to device, there is a corresponding variance in heat generated over the sensing element (inductor L11), resulting in varied trimmed resistance values from device to device.

SUMMARY OF THE INVENTION

Embodiments are directed to a circuit and method for improved trimming of a DCR sensing circuit where a sensing element is sensitive to self-heating or having a large tolerance. The circuit includes a resistive divider circuit coupled to a sensing element. The resistive divider circuit includes a trim resistor and two test points. Prior to trimming the trim resistor, an actual resistance of the sensing element is determined. A target voltage across a resistor to be trimmed is calculated according to the determined sensing element resistance and a known small trim current that is to be injected into the circuit during the trimming process. This injected trim current has a low current value so there is no self-heating of the sensing element. In other words, the injected trim current is insufficient to increase the temperature of the sensing element. Then, the trim resistor is trimmed while injecting this small trim current into the resistive divider and the voltage across the trim resistor is monitored, which provides good accuracy in the absence of self-heating the sensing element.

In an aspect, a method of sensing current using direct current resistance sensing is disclosed. The method includes configuring a circuit having a current sensing element, a load coupled to the current sensing element, and a resistive divider circuit having a trim resistor. The resistive divider circuit is coupled across the current sensing element, and the current sensing element has an unknown resistance value. The method also includes measuring the resistance value of the current sensing element, and calculating a target voltage value across the trim resistor according to the measured resistance value and a predetermined known trim current value. The method also includes injecting a trim current having the predetermined known trim current value into the circuit such that the trim current passes through the trim resistor, and trimming the trim resistor while the trim current is being injected. A trim resistor voltage across the trim resistor is monitored during trimming, and the trim resistor is trimmed until the monitored trim resistor voltage equals the target voltage value. In some embodiments, measuring the resistance value of the current sensing element comprises operating the circuit to pass current through the current sensing element, wherein the current has a predetermined known current value, measuring a voltage across the current sensing element while the current passes through the current sensing element, and calculating the resistance value of the current sensing element according to the predetermined known current value and the measured voltage across the current sensing element. In some embodiments, the circuit is turned ON to generate the current having the predetermined known current value and the circuit remains ON for a duration that equals a minimum acceptable time for the voltage across the current sensing element to stabilize. In some embodiments, the circuit is further configured to include a switch coupled to the current sensing element, and operating the circuit to pass current through the sensing element comprises turning ON the switch. In some embodiments, method also includes calculating a divider ratio that equals a virtual target resistance value of the current sensing element divided by the measured resistance value, wherein the virtual target resistance value corresponds to a desired voltage measured across the current sensing element while the trim current passes through the current sensing element. In some embodiments, the method also includes calculating a target resistance value for the trim resistor according to the calculated divider ratio. In some embodiments, the resistive divider circuit also includes a first resistor having a known first resistance value, and the target resistance value is calculated according to the calculated divider ratio and the known first resistance value. In some embodiments, the target voltage value across the trim resistor corresponds to a voltage across the trim resistor when the trim resistor is properly trimmed to the target resistance value while the trim current is being injected. In some embodiments, the circuit is further configured to include a switch coupled to the current sensing element, and trimming the trim resistor occurs while the trim current is being injected and the switch is turned ON. In some embodiments, the current sensing element comprises an inductor, and the unknown resistance value is a resistance value of a resistance part of the inductor. In some embodiments, the circuit comprises a switch mode power supply. In some embodiments, the circuit comprises a switch mode power supply having a current doubler-configuration. In some embodiments, the current sensing element comprises a printed circuit board, and the unknown resistance value is a resistance value of the printed circuit board.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a trimming method. Those of ordinary skill in the art will realize that the following detailed description of the trimming method is illustrative only and is not intended to be in any way limiting. Other embodiments of the trimming method will readily suggest themselves to such skilled persons having the benefit of this disclosure.

Reference will now be made in detail to implementations of the trimming method as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 2:
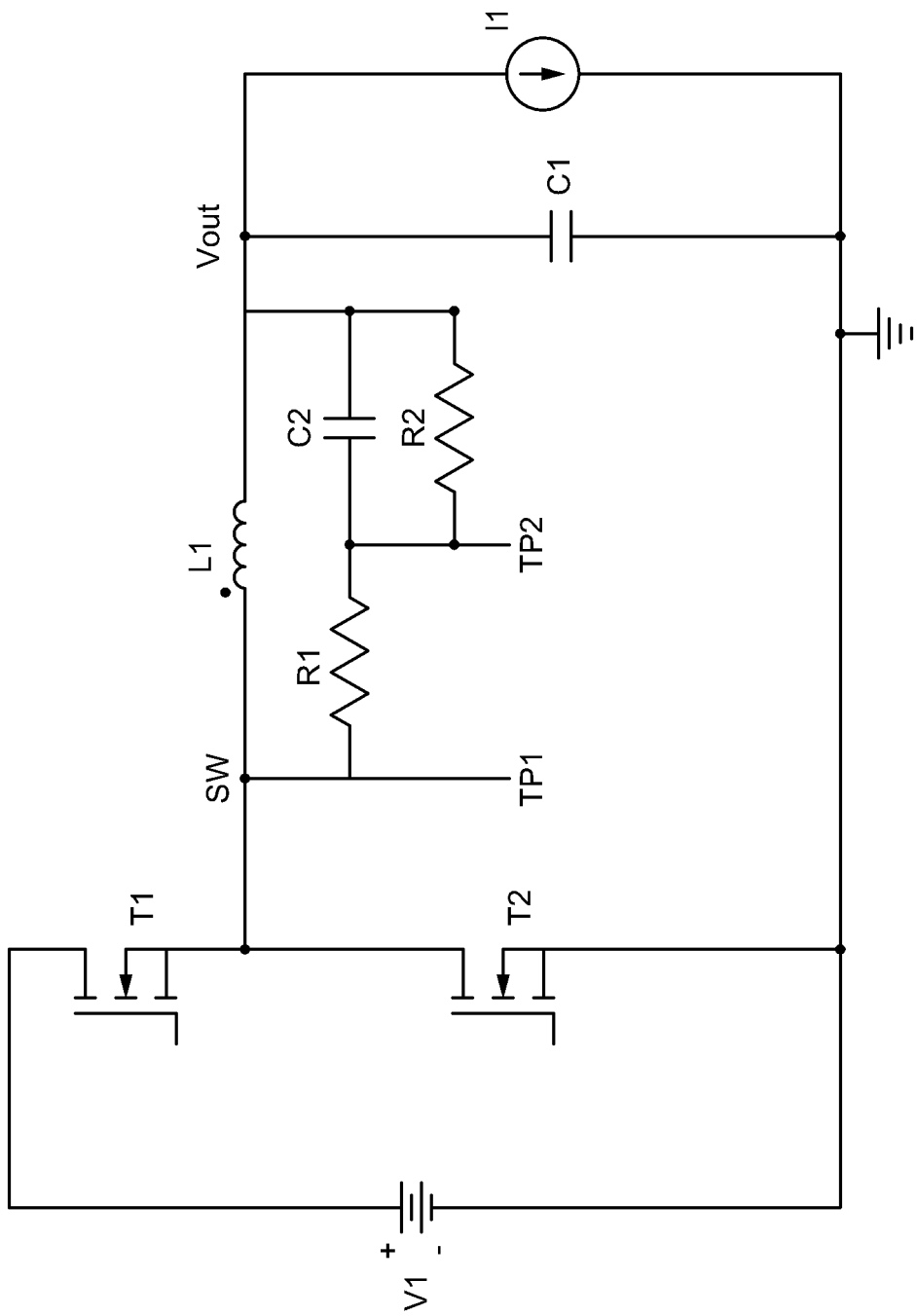
FIG. 2 illustrates an SMPS circuit schematic to which DCR sensing is applied according to some embodiments.

FIG. 2 illustrates an SMPS circuit schematic to which DCR sensing is applied according to some embodiments. The input voltage, V1, is pulse width modulated (PWM) by transistors T1 and T2. The resulting PWM waveform at switching node SW is then averaged to a DC voltage by the filter formed by inductor L1 and capacitor C1. Current provided to a load is represented as I1. The SMPS circuit shown in FIG. 2 does not include a digital controller for implementing trimming of DCR sensing. Instead, a resistive divider including resistors R1 and R2 is coupled across the inductor L1 for implementing DCR sensing. The inductor L1 is considered the sensing element and includes both an inductance part L and a resistance part RL. The SMPS is operated so as to generate a PWM signal at the switching node SW, and current is drawn through the branching current pathways to the load, specifically branching at the inductor L1 and the resistor R1, and branching at the capacitor C2 and the resistor R2. The characteristics of the resistive divider components R1, R2, C2 are chosen such that a cutoff frequency of the RC-filter R1, R2, C2 is matched to a cutoff frequency of the inductor L1. With such a configuration, a voltage over the capacitor C2, and therefore also over the resistor R2, is proportional to the voltage over the resistance part RL, which enables indirect measurement of the current through the resistive part RL. The resistive divider formed by resistors R1, R2 allows trimming of the value of the resistive part RL of the inductor L1, and can be achieved by physical trimming of either of the resistors R1 or R2. In this exemplary embodiment, the resistor R2 is a trim resistor. The SMPS circuit also includes two test points, TP1 and TP2. A measurement system (not shown) is connected to the SMPS circuit to take measurements, such as voltage measurements at test point TP1, test point TP2, and Vout, and to control operation of the device, such as turning ON and OFF the transistors T1 and T2, for performing the sensing and trimming operations described below.

In order to trim resistor R2 to the proper resistance, an actual resistance of the resistance part RL of the inductor L1 is first measured. The actual resistance of the resistance part RL is referred to as RL_measured. The resistance RL_measured is determined by operating the device (SMPS circuit) and measurement system in such a way that a known current is generated within the normal operating range of the device, which results in a current, for example 10 A, running through the inductor L1 for a short controlled time period. The device is only operating until the measurement system has obtained a stable measurement of V_TP1, this avoids self-heating. The voltage V_TP1 is measured between the test point TP1 and Vout while the known current is running through the inductor L1. The voltage V_TP1 measured between TP1 and Vout corresponds to the voltage across the inductor L1. The resistance RL_measured is calculated using the known current generated by operating the device and the measured voltage V_TP1.

The calculated resistance RL_measured is used to calculate a divider ratio k according to equation (1):

$$\frac{RL\_target}{RL\_measured} = k \qquad (1)$$

where RL_target is a virtual target resistance value of the resistive part RL. The virtual target resistance value RL_target corresponds to a desired voltage measured between test point TP2 and Vout at a defined current, for example the known current value corresponding to operating the device to determine RL_measured.

The RL_target value is determined according to equation (2):

$$RL\_target = \frac{RL\_MAX}{\frac{R1\_MIN}{R2}+1} \qquad (2)$$

where RL_target is determined as the resistance level where the tolerances of the included parts generates the maximum RL_target value without any trimming being done. This occurs when the resistive part RL is at maximum tolerance (RL_MAX) and with the resistance value of resistor R1 at a minimum tolerance (R1_MIN). A requirement to be met is that it must be possible to achieve the same virtual resistance RL_target, or larger, by trimming the resistor R2, when the inductor resistance RL and the trim resistor have their minimum tolerances (RL_MIN) and (R2_MIN), respectively, and the resistor R1 has it's maximum tolerance (R1_MAX). This requirement is referred to as the minimum tolerance of the resistive part RL, or simply RL_TOL_MIN. A trim resistor has a maximum trim ratio, TR_MAX, setting the boundaries for the system according to equations (3) and (4):

$$RL\_TOL\_MIN\_TRIM = \frac{RL\_MIN}{\frac{R1\_MAX}{R2\_MIN*TR\_MAX}+1} \qquad (3)$$

$$RL\_TOT\_MIN\_TRIM \geq RL\_target \qquad (4)$$

Once the resistance RL_measured is determined and the divider ratio k is calculated according to equation (1), the resistance value to which the trim resistor R2 is to be trimmed can be calculated. Since the divider ratio k also corresponds to the divider ratio of R1 and R2, equation (5) can be used to calculate the trimmed resistance value to which the trim resistor R2 is to be trimmed:

$$k = \frac{R2}{R1+R2} = \frac{1}{\frac{R1}{R2}+1} \Rightarrow R2 = \frac{R1}{\frac{1}{k}-1}. \qquad (5)$$

Once the resistance value to which the trim resistor R2 is to be trimmed is calculated, the trim resistor R2 is actually trimmed to this desired resistance value. To trim the trim resistor R2 to the desired resistance value, a trim current I_trim, selected so that a signal in the range of volts is generated in the V_TP2 node, is injected at the test point TP2 while the transistor T2 is turned and remains ON. The trim current I_trim is a well controlled and known value, for example 10 mA. The trim current I_trim, the known resistance of resistor R1, and the resistance value to which the trim resistor R2 is to be trimmed (from equation (5)) can be used to calculate a target voltage V_TP2 measured between the test point TP2 and Vout that corresponds to a voltage across trim resistor R2 when the trim resistor R2 is properly trimmed while the trim current I_trim is injected. Equation (6) is used to calculate this target voltage V_TP2, where V_TP2 represents the voltage between test point TP2 and the node Vout, or simply Vout:

$$V\_TP2 = \frac{I\_trim}{\frac{1}{R1} + \frac{1}{R2}} = \frac{I\_trim}{\frac{1}{R1} + \frac{k-1}{R1}}. \quad (6)$$

The test point TP2 is monitored for the voltage between TP2 and Vout, and the trim resistor R2 is trimmed, while the trim current I_trim is being injected at the test point TP2, until the monitored voltage at the test point TP2 reaches the target voltage V_TP2 calculated in equation (6).

In summary, once the resistance of the sensing element, for example RL_measured, is determined, it can be calculated what the resistance of the resistive divider circuit should be. The resistance of resistor R1 is known and tightly controlled, which leads to calculating what the resistance of the trim resistor R2 should be trimmed to according to the divider ratio k, as shown in equations (1) and (5). This leads to calculating what the target voltage V_TP2 at the test point 2 should be, as shown in equation (6) during the actual trimming of the trim resistor R2. The trim resistor R2 can then be trimmed to the desired resistance value by injecting the trim current I_trim and monitoring the voltage at the test point TP2. Trimming of the trim resistor R2 is complete when the monitored voltage at the test point TP2 reaches the target voltage V_TP2.

Figure 1:
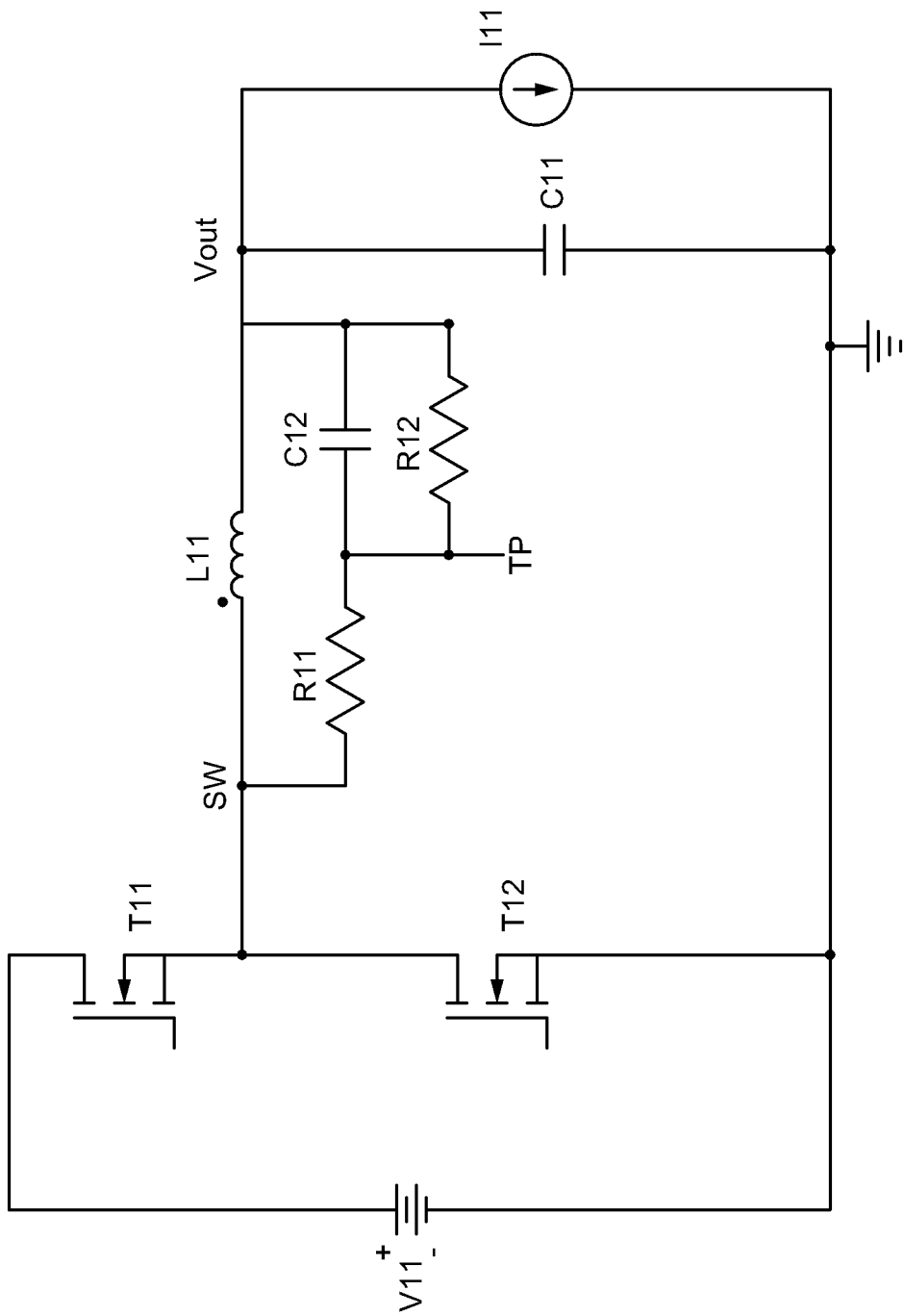
FIG. 1 illustrates an exemplary simple SMPS circuit schematic to which DCR sensing is applied.

In an exemplary configuration, the resistance values of resistors R1 and R2 are in the kiloohm range, and as such, to generate the necessary high voltage for monitoring the trimming process only a small current, for example milliamps, is needed to be injected at the test point TP2. In contrast, conventional DCR techniques run much larger current through the sensing element during trimming, such as running 10 amps through the inductor L11 in FIG. 1. In the conventional DCR technique applied to the circuit of FIG. 1, the device, such as transistor T12, is turned ON to run current through the inductor L11 during the actual trimming of the trim resistor R12, but since the restive part RL of the inductor L11 is relatively small, a large current is required, which leads to the self-heating issue previously described. If, instead, a small current, such as 10 mA is injected into the circuit, as in the technique of the present application, then approximately a milliwatt of power is dissipated across the inductor L1, and self-heating is no longer an issue. This small current is substantially 1,000 times smaller than the current used in the conventional technique, resulting in 1,000,000 times less power dissipation across the sensing element.

Figure 3:
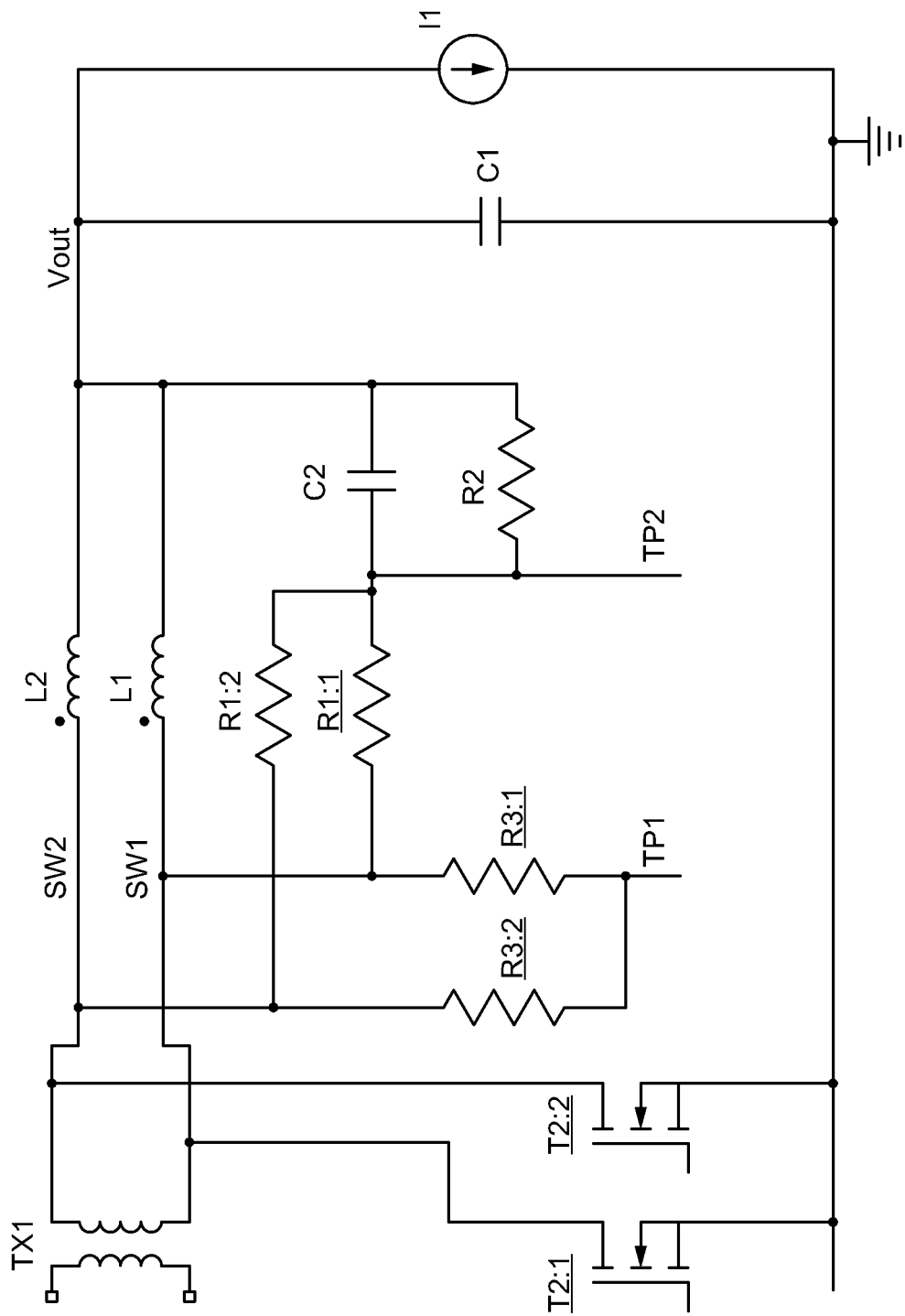
FIG. 3 illustrates a current-doubler circuit schematic to which DCR sensing is applied according to some embodiments.

The equations (1)-(3) illustrate that is it possible to use the trimming method of the present application to first measure a sensing element resistance, RL_measured, where a corresponding resistive divider circuit has a well known resistance R1, and then apply a known trim current I_trim into a sense point (test point), to accurately achieve a correct trim value. The equations (2)-(6) are derived in respect to the SMPS circuit and resistive divider circuit shown in FIG. 2. It is understood that similar, alternative equations can be derived for alternatively configured circuits. For example, the trimming method can also be applied to a current-doubler circuit configuration, where two inductors share the output current equally. FIG. 3 illustrates a current-doubler circuit schematic to which DCR sensing is applied according to some embodiments. The trimming method is applied similarly to the circuit-doubler circuit shown in FIG. 3 as to the SMPS circuit shown in FIG. 1. For example, the device is operated so that a known current is conduced through the inductors L1 and L2. Current balance is achieved by equal impedances in the two branches. The two resistors R3:1, R3:2 and R1:1, R1:2 average any asymmetries in current, due to tolerances, between the branches. While the known current is conduced through the inductors L1 and L2, a voltage is measured between the test point TP1 and Vout, from which a resistive part RL_measured is calculated. In this case, the measured RL_measured is a resistance equivalent to the parallel resistance parts of the two inductors L1 and L2. The equations (1)-(6) apply for the current-doubler circuit as well. However, it must be noted that R1:1 and R1:2 should be doubled compared to the R1 value in the equations since it can be seen that the resistors R1:1, R1:2 will operate in parallel when doing a DC analysis of the circuit. The resistance values of R3:1 and R3:2 are used to average the measured voltage when determining RL_target. Once the desired target voltage V_TP2 is determined from the equations, the trim resistor R2 is trimmed while the test point TP2 is monitored for the voltage between TP2 and Vout and the trim current I_trim is applied. The target voltage value V_TP2 corresponds to half the value based on the trim current I_trim times RL_measured, since the inductors L1 and L2 share the current. In some embodiments, the resistors R3:1 and R3:2 for the current-doubler circuit can be placed in the measurement equipment.

Figure 4:
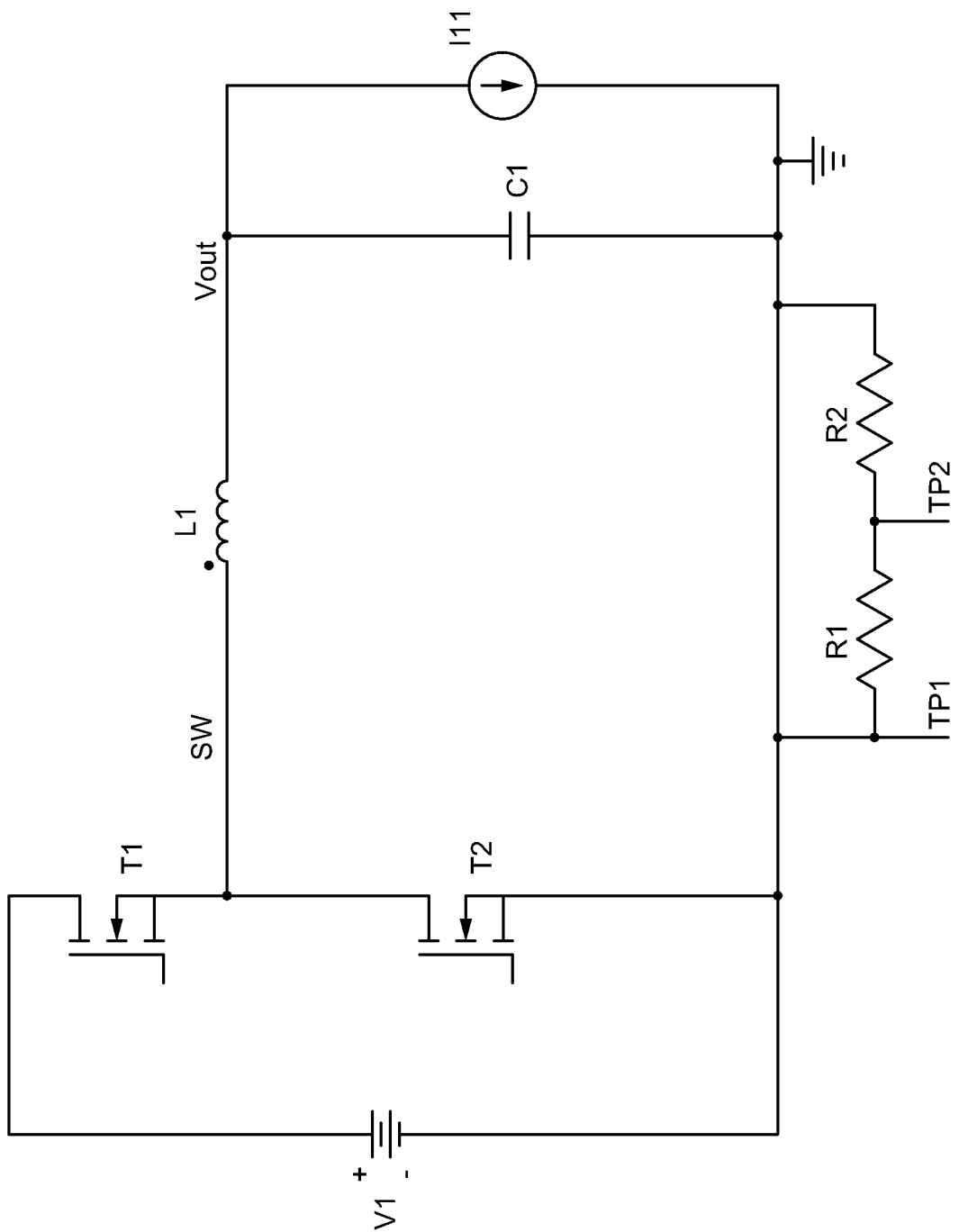
FIG. 4 illustrates a generalized application of the trimming method according to some embodiments.

In general, the trimming method is applicable for every condition where a current is measured over an unknown resistive element and it is not desired to add a separate sensing element to the circuit. FIG. 4 illustrates a generalized application of the trimming method according to some embodiments. As applied to the circuit of FIG. 4, the unknown resistance is R_PCB and the resistor being trimmed is trim resistor R2. The remainder of the circuit is an SMPS. Equations (1)-(6) equally apply to FIG. 4, simply replace the resistance part RL with R_PCB. When the current is being sensed over an unknown resistive element, such as R_PCB, it is undesirable to add extra losses by adding another sensing resistor to measure the current, as the additional sensing resistor increases losses. Instead, the trimming method can be used in applications where the current is being sensed over a relatively unknown resistive element and it is desired to have a higher accuracy of that measurement. The trimming method can be used in any application where there is a sensing element (R_PCB) to be trimmed, where the resistance of the sensing element is not fully known, and the actual sensing element is not to be physically trimmed. Using the trimming method, a resistor divider is added to the circuit, the actual resistance of the sensing element is calculated by running a known current through the sensing element and measuring the corresponding voltage across the sensing element, then calculating a target voltage across the resistor to be trimmed based on the determined resistance value of the sensing element, and then physically trimming the trim resistor while a small, known trim current is injected into the circuit to run through the trim resistor, and the voltage across the trim resistor is monitored.

The present application has been described in terms of specific embodiments incorporating details to facilitate the understanding of the principles of construction and operation of the trimming method. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A method of sensing current using direct current resistance sensing, the method comprising:
   a. configuring a circuit having a current sensing element, a load coupled to the current sensing element, and a resistive divider circuit having a trim resistor, the resistive divider circuit coupled across the current sensing element, wherein the current sensing element has an unknown resistance value;
   b. measuring the resistance value of the current sensing element;
   c. calculating a target voltage value across the trim resistor according to the measured resistance value and a predetermined known trim current value;
   d. injecting a trim current having the predetermined known trim current value into the circuit such that the trim current passes through the trim resistor;
   e. trimming the trim resistor while the trim current is being injected, wherein a trim resistor voltage across the trim resistor is monitored during trimming, and the trim resistor is trimmed until the monitored trim resistor voltage equals the target voltage value.

2. The method of claim 1 wherein measuring the resistance value of the current sensing element comprises:
   i. operating the circuit to pass current through the current sensing element, wherein the current has a predetermined known current value;
   ii. measuring a voltage across the current sensing element while the current passes through the current sensing element; and
   iii. calculating the resistance value of the current sensing element according to the predetermined known current value and the measured voltage across the current sensing element.

3. The method of claim 2 wherein the circuit is turned ON to generate the current having the predetermined known current value and the circuit remains ON for a duration that equals a minimum acceptable time for the voltage across the current sensing element to stabilize.

4. The method of claim 3 wherein the circuit is further configured to include a switch coupled to the current sensing element, and operating the circuit to pass current through the sensing element comprises turning ON the switch.

5. The method of claim 2 further comprising calculating a divider ratio that equals a virtual target resistance value of the current sensing element divided by the measured resistance value, wherein the virtual target resistance value corresponds to a desired voltage measured across the current sensing element while the trim current passes through the current sensing element.

6. The method of claim 5 further comprising calculating a target resistance value for the trim resistor according to the calculated divider ratio.

7. The method of claim 6 wherein the resistive divider circuit further comprises a first resistor having a known first resistance value, and the target resistance value is calculated according to the calculated divider ratio and the known first resistance value.

8. The method of claim 7 wherein the target voltage value across the trim resistor corresponds to a voltage across the trim resistor when the trim resistor is properly trimmed to the target resistance value while the trim current is being injected.

9. The method of claim 1 wherein the circuit is further configured to include a switch coupled to the current sensing element, and trimming the trim resistor occurs while the trim current is being injected and the switch is turned ON.

10. The method of claim 1 wherein the current sensing element comprises an inductor, and the unknown resistance value is a resistance value of a resistance part of the inductor.

11. The method of claim 1 wherein the circuit comprises a switch mode power supply.

12. The method of claim 1 wherein the circuit comprises a switch mode power supply having a current doubler-configuration.

13. The method of claim 1 wherein the current sensing element comprises a printed circuit board, and the unknown resistance value is a resistance value of the printed circuit board.

* * * * *